(12) United States Patent
Anacker

(10) Patent No.: US 6,842,047 B1
(45) Date of Patent: Jan. 11, 2005

(54) ELECTRICAL PARALLEL PROCESSING FREQUENCY CODED LOGIC

(76) Inventor: David Carlyle Anacker, P.O. Box 1160, Fremont, CA (US) 94538

(*) Notice: Subject to any disclaimer, the term of this patent is extended or adjusted under 35 U.S.C. 154(b) by 49 days.

(21) Appl. No.: 10/447,611

(22) Filed: May 28, 2003

Related U.S. Application Data

(60) Provisional application No. 60/459,430, filed on Apr. 1, 2003.

(51) Int. Cl.[7] ............................................. H03K 19/20
(52) U.S. Cl. ......................................... 326/104; 326/99
(58) Field of Search ........................... 326/104, 99, 136

(56) References Cited

U.S. PATENT DOCUMENTS

| | | | | |
|---|---|---|---|---|
| 4,564,774 A | * | 1/1986 | Tashiro et al. | 326/99 |
| 4,638,188 A | * | 1/1987 | Cray | 326/99 |
| 4,706,299 A | * | 11/1987 | Jorgensen | 398/176 |
| 6,151,428 A | | 11/2000 | Vahala et al. | |

\* cited by examiner

*Primary Examiner*—James H. Cho

(57) ABSTRACT

A method and apparatus for electrical parallel processing logic operations in which one and zero are represented by presence and absence, respectively, of a sinusoidal wavetrain. Different frequency information channels can be handled simultaneously and independently. The form of data representation is strictly preserved from gate input to output thereby ensuring compatibility with conventional memory, counter, register, and other digital logic design. Input impedance is high and output impedance is minuscule, conducive to high fan out. Because arbitrarily sophisticated circuits, including full scale computers, may be essentially entirely built out of Boolean logic gate combinations, the proposed parallel processing logic enables parallel processing in computers without recourse to timesharing, redundant multiprocessor architecture, or still speculative "quantum computer" hardware.

5 Claims, 6 Drawing Sheets

$F(t) = a_0/2 + \sum_{n=1}^{\infty} a_n \cos n\omega t$, where $a_n = (2\omega/\pi)\int_0^{\pi/\omega} F(t)\cos n\omega t\, dt$. In particular, $a_1 = (8A/\pi)\{(T/(4A^2))[4A^2-T^2]^{1/2} + \pi/4 - (1/2)\arccos(T/(2A)) - (1/(4A))[4A^2-T^2]^{1/2}\}$.

If $T = 1.186\,A$, this formula yields $a_1 = A$, i.e., if $2A\cos\omega t$ is truncated at $+/- 1.186\,A$, the frequency $\omega$ component of the truncated waveform has amplitude A.

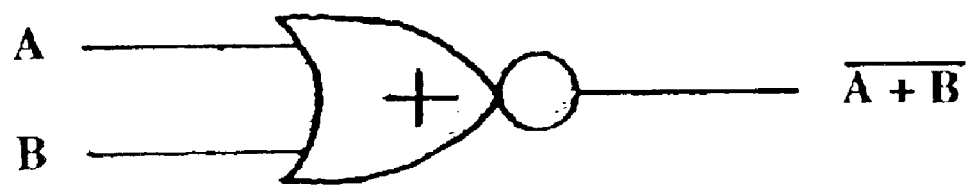
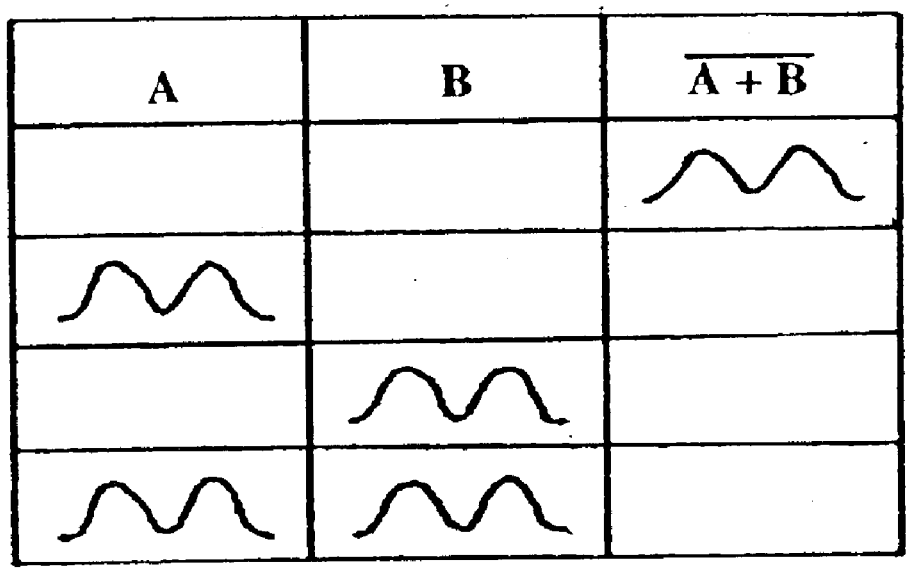
FIG. 5

US 6,842,047 B1

ELECTRICAL PARALLEL PROCESSING FREQUENCY CODED LOGIC

CROSS REFERENCE TO RELATED APPLICATIONS

This application is entitled to the benefit of Provisional Patent Application Ser. No. 60/459,430 filed 2003 Apr. 1.

BACKGROUND

Field of Invention

This invention relates to digital logic gates such as are used for constructing computing or control machinery.

BACKGROUND AND SUMMARY OF INVENTION

Although for many years software has been available which allows computers to alternate CPU attention rapidly between multiple programs, or "timeshare", truly simultaneous execution of multiple programs has traditionally been accomplished through hardware redundancy, i.e., multiprocessor architecture. Conventional individual digital logic gates have not been able to actually process different information channels simultaneously. Vahala, Paiella, and Hunziker (VPH) have recently demonstrated a new all optical gate architecture which makes a start in this direction (claim 19 of Nov. 21, 2000 U.S. Pat. No. 0,615,1428). VPH gates represent 1 and 0 by vertical and horizontal polarized Light, respectively; they require two different wavelength inputs and produce a third larger wavelength output. Besides an apparent unwieldiness owing to the multiplicity of wavelengths even before parallel processing is involved, these innate characteristics are unfortunately sufficient to cause certain conventionally non problematic gate and input data combinations to fail, including examples shown in FIG. 6. Most notably, a conventional flip flop architecture using VPH rather than conventional nands, fails to go into either the $Q=1$, $Q'=0$ or $Q=0$, $Q'=1$ state given $R=0$, $S=1$. (Referring to FIG. 6, $Q=\lambda_3^{\|}$, $Q'=\lambda_4^{\perp}$ implies both $\lambda_3 > \lambda_4$ an $\lambda_4 > \lambda_3$, and impossibility; $Q=\lambda_3^{\perp}$, $Q'=\lambda_4^{\|}$ implies $\lambda_1^{\perp}$ nanded with $\lambda_4^{\|}$ yields $\lambda_3^{\perp}$, also an impossibility.) Conventional memory, register, and counter logic based on this type of flip flop accordingly will not accommodate VPH hardware, either. It would seem difficult to skirt such problems while designing gate architecture with parallel processing capability unless new designs preserve one hallmark of conventional gates, specifically invariance, i.e. preservation, of data representation from gate input to output.

"Quantum" computers are in developmental infancy, e.g. current state of the art machinery computes prime factors of fifteen, and are restricted to a relatively minute set of known applications. In searching for circuitry which will reduce the bottleneck more immediately, which will simultaneously run a plurality of conventional computer programs having no unusual constraints on length or complexity, it is suggestive to consider telephone line, fiber optic cable, or the earth's atmosphere wherein many different electromagnetic wave communications propagate simultaneously. For example, many different AIM stations broadcast throughout the same airspace simultaneously by each employing a different frequency radio wave to carry their information. Although research activity indicates all optical gates are a much desired developmental goal for various applications, at the present time almost all computing is still performed using electrical voltages rather than light. Intuitively, at least, it would seem almost self evident that the simplest way to represent binary data by voltages of a particular frequency would be to represent unity by a predetermined magnitude (, hereafter referred to as unity magnitude,) sinusoidal voltage of said frequency, and zero by absence of said frequency voltage. Because it is well known that capacitors, inductors, and resistors can simultaneously and independently carry different frequency electrical voltages, one might then hope to construct Boolean logic gates completely out of such linear elements. Any gate so constructed would be equally successful processing data at any other frequency if it could somehow be designed to correctly process data at any one particular frequency. Unfortunately, it happens one may prove no purely linear electrical circuit can function as, for example, a nor gate if zero and one are represented in the proposed way. A process of elimination, then, can lead to contemplation not only of resistors, inductors, and capacitors but also simple non linear elements such as diodes in a search for workable gate configurations. The present invention is a new approach to processing information that has been encoded in frequency. Operation is entirely in the non optical domain and relies on new configurations of commercially available electronic components to achieve parallel processing within individual logic gates.

OBJECTS AND ADVANTAGES

The above background introduces the concept of enabling a computer to run a large number of different programs simultaneously by assigning each program a different frequency information channel wherein each one or zero bit of information is represented by the presence or absence, respectively, of a unity amplitude sinusoidal voltage of said frequency and by redesigning the traditional computer components to handle different frequency wave trains simultaneously and independently. Since all computer circuits (e.g., registers, memory, counters, multiplexers, decoders, encoders, flip flops, etc.) are completely buildable out of just the basic logic gates, sometimes augmented with a clock, necessary hardware redesign reduces to just these few components. Although separate from this invention, compatible clock redesign is summarized later. An or gate by itself will be formally claimed in the present application, but the not gate also comprises a likely adjunct in various possible embodiments since all logic gates can be built completely out of or and not gates. The present specification is mostly confined to a discussion of such gates possessing the above novel capabilities and advantageous application. Additional objects and advantages of the present invention are to provide gates in which data representation is strictly preserved from gate input to output thereby ensuring compatibility with conventional memory, counter, register, and other logic design. Still further objects and advantages will become apparent from a consideration of the ensuing description and drawings.

BRIEF DESCRIPTION OF DRAWINGS

FIG. 5 illustrates operation of proposed or and not gates in series as a nor gate.

Figure 1:
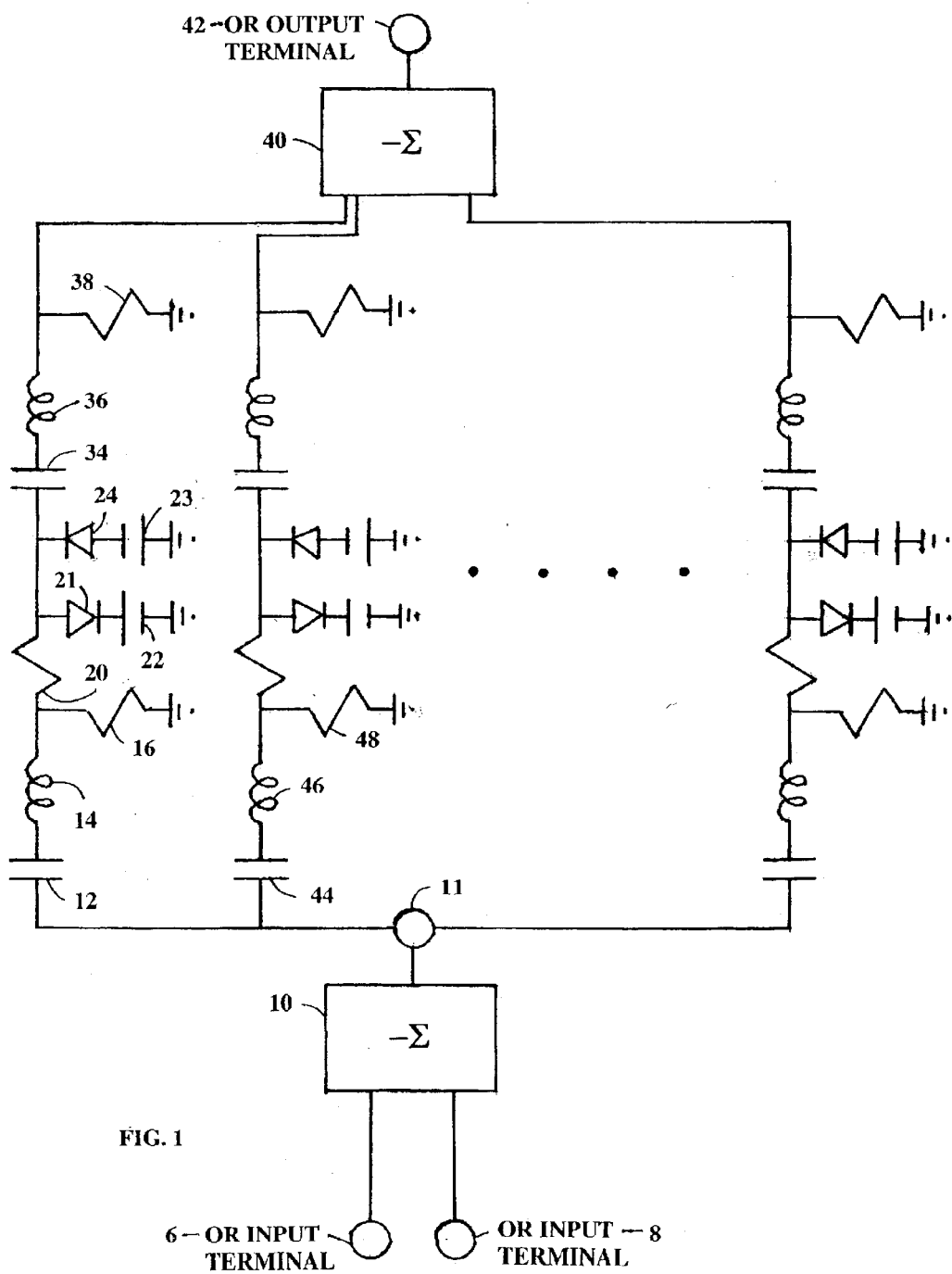
FIG. 1 shows basic layout of the proposed or gate.

REFERENCE NUMERALS IN DRAWINGS 6 or input terminal
8 or input terminal 10 first inverting voltage adder
11 node terminal
12 capacitor
14 inductor
16 resistor
20 resistor
21 semiconductor diode
22 positive direct current bias to ground
23 negative direct current bias to ground
24 semiconductor diode
26 capacitor
28 resistor
29 non zener semiconductor diode
30 zener diode
31 zener diode
32 non zener semiconductor diode
34 capacitor
36 inductor
38 resistor
40 second inverting voltage adder
42 or output terminal
44 capacitor
46 inductor
48 resistor
50 not input terminal
52 terminal supplying sinusoidal voltage representing one
54 not output terminal

DETAILED DESCRIPTION

Figure 2:
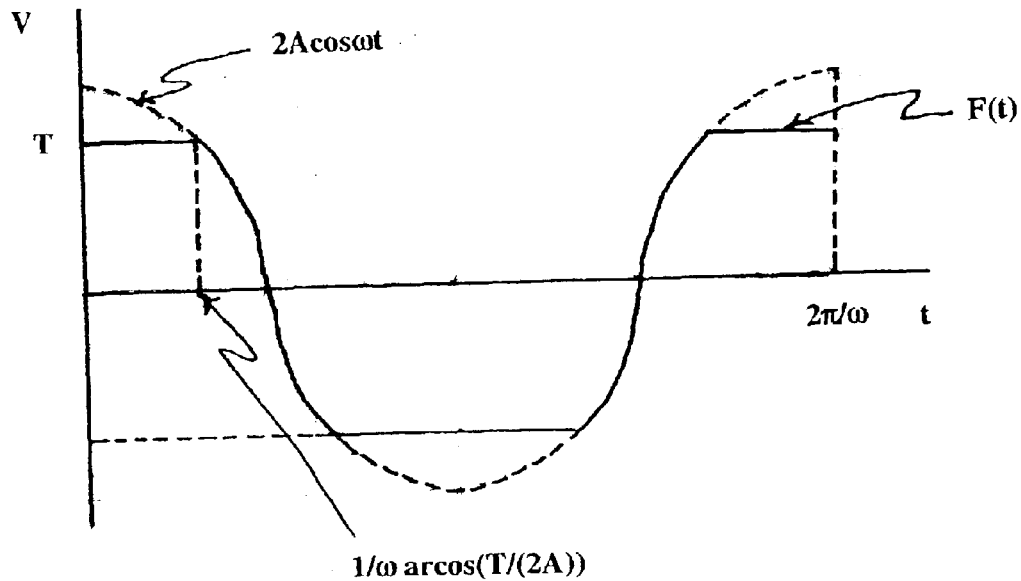
FIG. 2 shows Fourier analysis behind or gate design.
Figure 3:
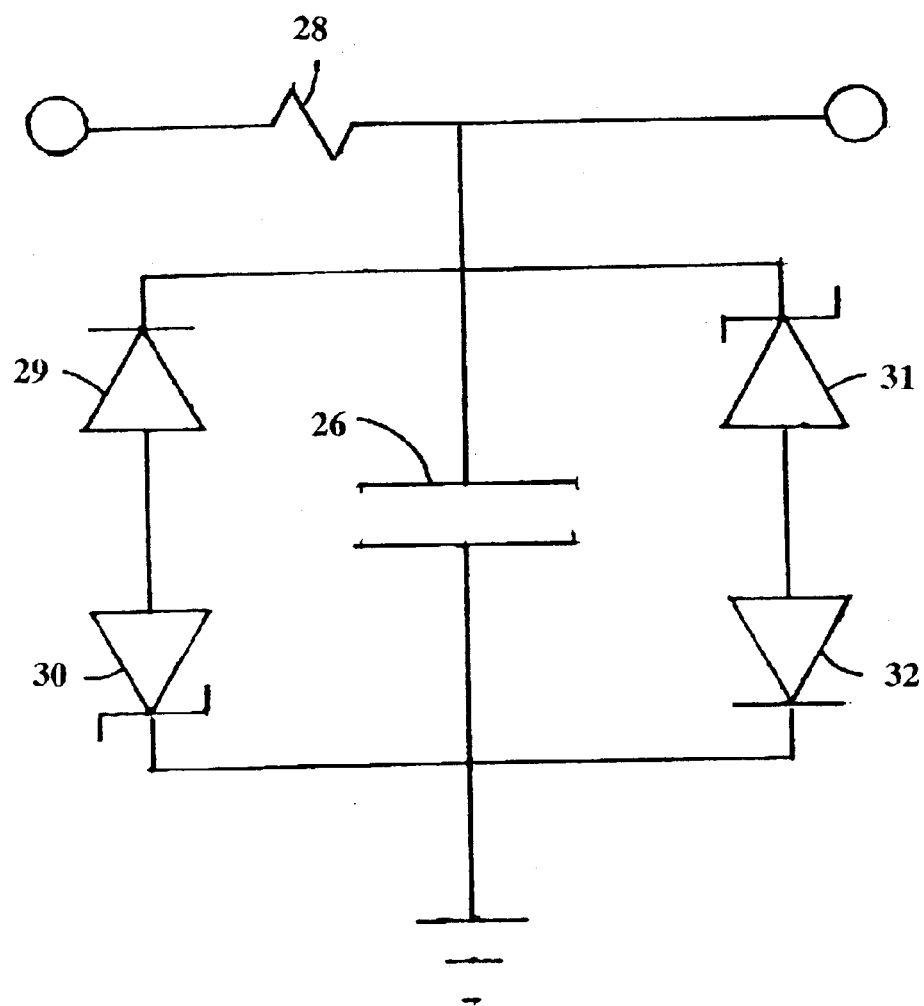
FIG. 3 shows a useable alternative clipper circuit.

FIGS. 1,2,3—Basic or Gate Embodiment

FIGS. 1–3 illuminate basic layout and embodiment of the proposed or logic gate wherein zero and one are represented, respectively, by sinusoidal voltages of null and unity amplitude, comprising:

a pair of or input terminals 6 and 8 to receive input data wave trains, a nor output terminal 42 to transmit an output data wave train, and a ground voltage supply terminal;

an inverting voltage adder 10 (e.g., a conventional inverting operational amplifier configuration with equal feedback and twin input resistors) which transmits the negative sum of terminal 6 and 8 voltage to a node terminal 11;

a plurality of parallel filtering paths connecting node 11 to a second inverting voltage adder 40 (—again, for example, a standard operational amplifier inverting adder —) whose output is conveyed to or output terminal 42, wherein each parallel fitter path comprises a cascade of three individual voltage filters, specifically an RLC series filter, followed by a clipper circuit, followed by another RLC series filter. (e.g., parts 12, 14, 16; 20–24; 34, 36, and 38, respectively, of FIG. 1).

The following additional requirements apply in constructing the present embodiment; if one keeps in mind the basic design objectives of the or gate these will seem well motivated. Ignoring the 180° phase changes it introduces, inverting adder 10 would all by itself constitute an acceptable frequency encoded or gate were it not that it produces twice the correct output signal amplitude if both inputs are true. Because of generally different input data channel by channel, adder 10's output amplitude will need to either be reduced by one half or left alone on a channel by channel basis. The top most filter path will isolate signal channel of frequency $\omega_1=1/(L_{14}C_{12})^{1/2}$ from the voltage at node 11. In order not to have this filter load the adder, one must select $R_{16}$>>[adder 10 output impedance]. Clipper biases 22 and 23 are chosen to be plus or minus 1.186 times the forementioned unity amplitude voltage; set to this value, the indicated circuits will truncate any voltage of absolute value exceeding 1.186 unity amplitude. Fourier analysis of a sine wave V(t) of amplitude 2A and frequency $\omega$, truncated at $|V(t)|>1.186A$, reveals Fourier frequencies $n\omega$ with n=1 component having the original phase and amplitude A, independent of $\omega$ (see FIG. 2).

To avoid loading previous filter circuitry one must require $R_{20}$>>$R_{16}$.

The second RLC filter in the cascade is designed to pick off just the above mentioned n=1 signal. Correspondingly, one selects $1/(L_{36}C_{34})^{1/2}=\omega_1$ and half max current bandwidth $R_{38}/(2L_{36})<<\omega_1$. To avoid loading the first tuning circuit, one also selects $R_{38}$ much larger than $R_{16}$; one should also ensure, as would normally be expected with an operational amplifier based unit, that [input impedance of adder 40]>>$R_{38}$ Exactly analogous comments apply regarding each of the remaining parallel filter paths shown in FIG. 1.

There are just a few more specifications concerning the proposed or gate. Individual resonant frequencies $\omega_i$ and half max current bandwidths $\Delta\omega_i$ associated with the leftmost filter in each of the parallel paths must be selected to minimize interference between different data channels. Accordingly we require $|\omega_i-\omega_j|>>\Delta\omega_i, \Delta\omega_j$ for any adjacent parallel filter paths i and j. In all the discussion of RLC circuits, R denotes the sum of coil internal resistance $R_L$ plus separate external resistance $R_{ext}$; in every such filter one must choose $R_{ext}>>R_L$.

It is possible to work out simple systematic procedures for selecting all the electrical component parameters in accordance with the above constraints Also, since $\Delta\omega=[[R_{ext}+R_L]/R_L]2\rho coil/[\pi\mu_o r_{coil\ wire}r_{coil}]$ where $[[Rext+RL]/[RL]]\sim 1000$, miniaturizaton of the proposed or gate architecture without sacrificing density of available channels may sooner or later require incorporation of superconducting (i.e., $\rho$~0) coil.

Finally, it is possible to use an alternative clipping circuit shown in FIG. 3 provided $1/]R_{28}C_{26}]$>>[resonant frequency ($\omega_o$) of preceding filter], $R_{subsequent\ filter}$>>$[C_{26}\omega_o]^{-1}$>>$R_{preceding\ filter}$. Zener breakdown voltage $V_z$=1.186[unity amplitude voltage], Zener resistance $r_z$<<$R_{28}$, $R_{subsequent\ filter}$>>$R_{28}$>>$R_{preceding\ filter}$.

Figure 4:
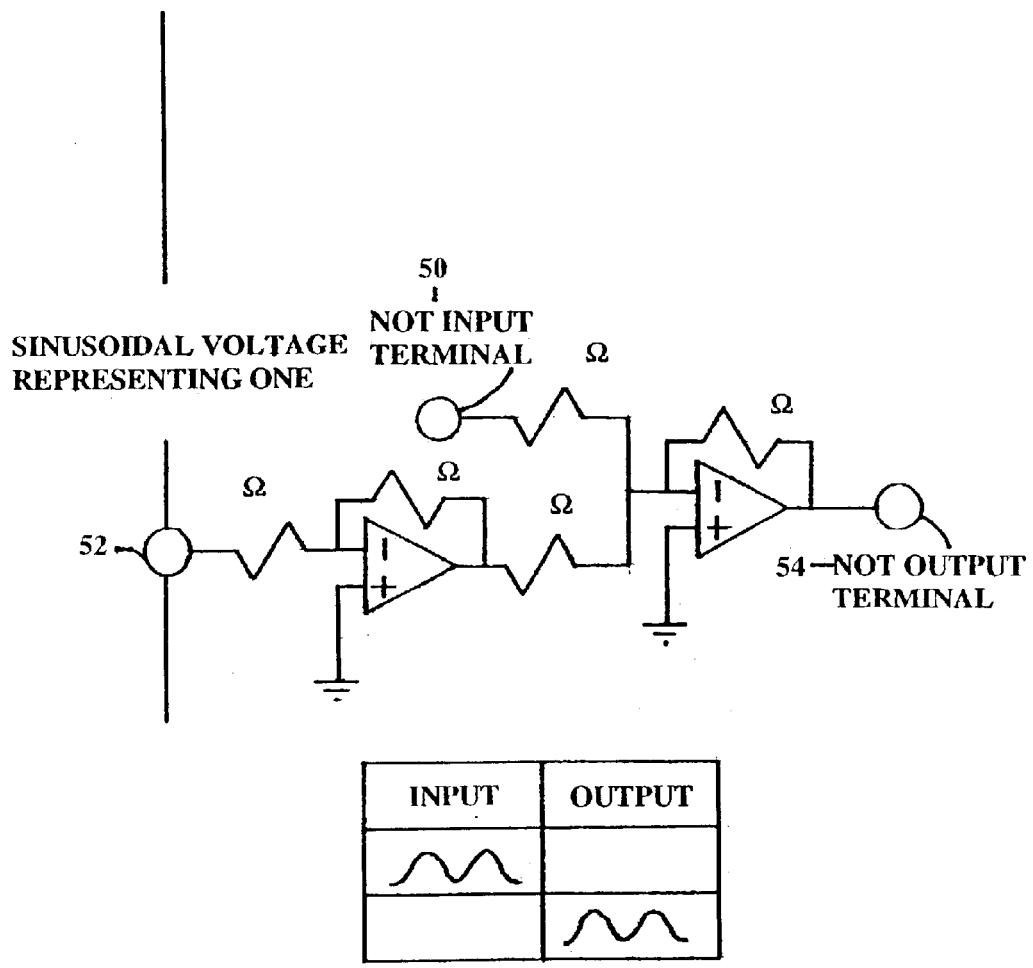
FIG. 4 shows an adjunct in various possible embodiments, a compatible not gate with Ω denoting like valued resistors.

FIG. 4—A Compatible Not Gate

A complete set of logic gates requires a not gate in addition to the or gate already discussed. A not gate converts one to zero and vice versa. Given the particular representation of one and zero adopted, circuitry shown in FIG. 4 suffices. Operational amplifiers are configured so as to add inverted voltage from not input terminal 50, plus voltage from terminal 52 carrying sinusoidal voltage representing one, and conduct the result to not output terminal 54. As mentioned previously, this gate isn't claimed but comprises, rather, a useful adjunct to the claimed invention in various possible embodiments.

Operation—FIGS. 1,2,3,4

Conventional digital electronic logic utilizes flat high and low voltages to represent binary data, but it is possible to use a sinusoidal voltage or lack thereof to represent 1 and 0, respectively. To illustrate this idea, gates can be denoted by the usual symbols and inputs and outputs summarized by truth tables—see FIG. 5. This specification discusses a complete set of gates —[or, not], in fact—that operates correctly upon such a data representation.

Regarding single channel operation there are two principal operating procedures for the logic of FIG. 1–4:

all signals representing 1 must have the same amplitude—
specifically $[1.186]^{-1}$ that of biases 22, 23, FIG. 1—and have a common frequency equal to one of the formentioned or gate RLC filter resonances.

Signals representing one, routed to different input terminals of a gate, must be phase matched.

The main concern encountered in satisfying the first of the above rules is to insure that data signal amplitudes do not attenuate appreciably over the spatial extent of any contemplated application. This problem is in turn tractable because the input and output stages of both gate designs use op amps which are readily available to provide arbitrarily low output impedance and megohm range input impedance. Phase coherency, the other requirement noted above, is in fact automatically maintained across both proposed gates providing the forementioned filter constraints are sufficiently adhered to.

A major incentive for the gate architecture just described is that it will be able to parallel process input data wavetrains from a multitude of information channels of different frequency with simple activation of not gate terminal 52 by a superposition of voltages representing unity in each of said channels.

For those so inclined, the above operating instructions and generalizations thereof for parallel processing, can be reencapsulated mathematically. If we assume the or gates in use have each resonant frequencies $\omega_1, \omega_2, \ldots, \omega_N$ and $|V_{22}, V_{23}|[1.186]^{-1}=A$, then one must apply a unity reference voltage $V_{52}(t)=\sigma_{n=1}^{N} A\sin(\omega_n t+\theta_n)$ to the bus supplying terminal 52 in order to establish a unity reference for each data channel. For the sake of discussion let $a_1, \ldots, a_N$ and $b_1, \ldots, b_N$ each denote one or zero. Then input data $V_{50}(t)=\sigma_{n=1}^{N} a_n A\sin(\omega_n t+\theta_n)$ applied at not input terminal 50 is "inverted" resulting in voltage $V_{54}(t)=\sigma_{n=1}^{N}(1-a_n)A\sin(\omega_n t+\theta_n)$ at not output terminal 54. Input data $V_6(t)=\sigma_{n=1}^{N} a_n A\sin(\omega_n t+\theta_n)$, $V_8(t)=\sigma_{n=1}^{N} b_n A\sin(\omega_n t+\theta_n)$ applied at or input terminals 6 and 8 results in voltage $V_{42}(t)=\sigma_{n=1}^{N}[a_n+b_n]/[1+\delta_2,[a_n+b_{n1}]]A\sin(\omega_n t+\theta_n)$ at or output terminal 42.

Conclusions, Ramifications, and Scope

Figure 6:
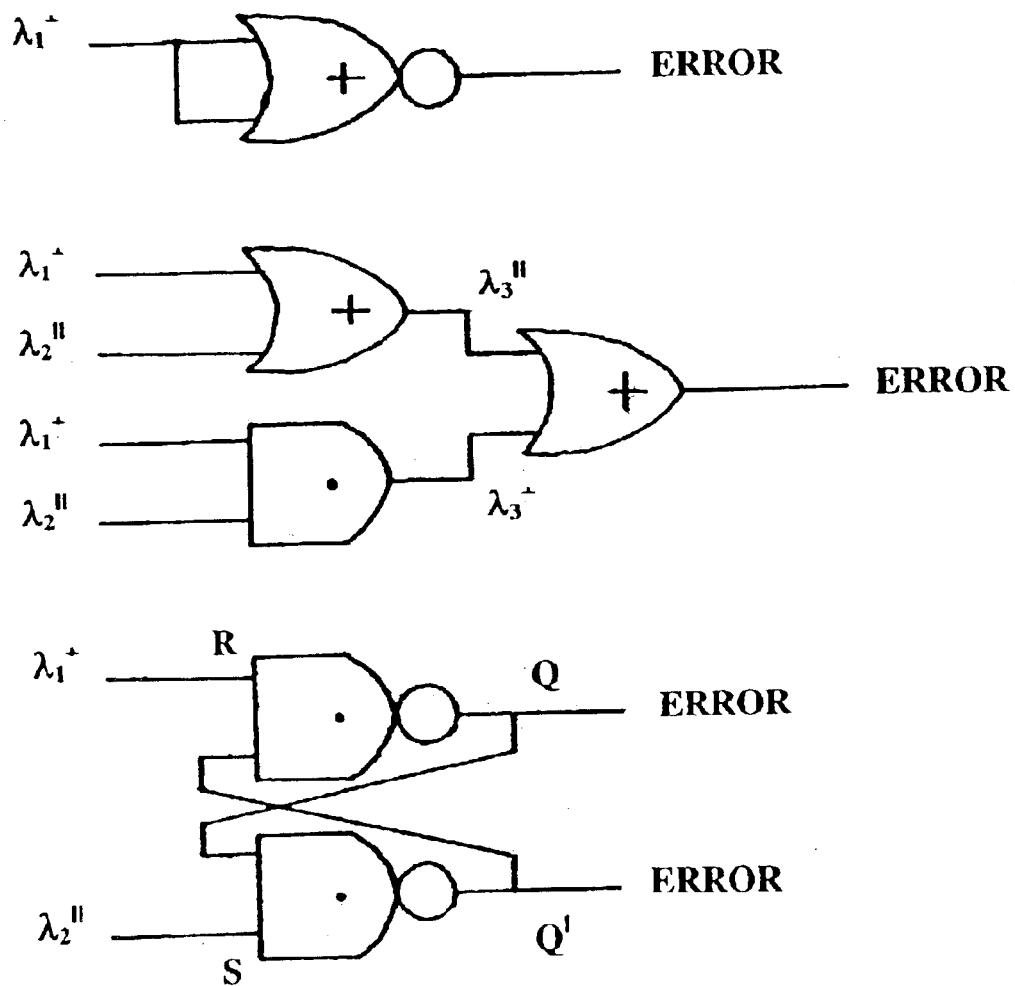
FIG. 6 shows gate combinations incompatible with VPH architecture.

The invented or gate has been described in terms of preferred embodiments. The invention, however, is not limited to the embodiments depicted and described. For example, when paired with a compatible not gate, such as shown in FIG. 4, the invention provides a complete basis for building any circuit to perform digital logic operations. There are numerous gate combinations which form complete bases, e.g. [nand], [nor], [or, not], etc. Since each of the other bases can be built out of or and not gates, they comprise alternate embodiments. One can doubtless build a circuit that will periodically ground but otherwise not modify input voltage; inputting to such a device a continuous unity magnitude sinusoidal voltage will then produce the requisite counterpart of the conventional digital clock signal. Employing such a clock and the previously described gates one can build flip flops via the same interconnections as usual, e.g., see FIG. 6; from flip flops one obtains memory, registers, and counters exactly as usual with conventional bi-level gates. In exactly the usual way one can also combine the proposed basic logic gates to construct multiplexers and decoders. Because all of its constituent parts are seen to be capable of being constructed out of the proposed gates and auxiliary clock, one may conclude that a complete digital computer may likewise be built. Finally, because the new gates and gate combinations handle different frequency information channels simultaneously and independently, it follows that this computer will also run multiple programs simultaneously and independently, without recourse to timesharing, multiprocessors, or quantum logic.

Thus the scope of the invention should be determined by the appended claims rather than the examples given.

What is claimed is:

1. A method for deriving an output data wavetrain within an electronic or logic gate wherein zero and one are represented, respectively, by sinusoidal voltages of null and unity amplitude, comprising:
  (a) providing a pair of or input terminals to receive input data wavetrains, an or output terminal to transmit said output data wavetrain, and a ground voltage supply terminal,
  (b) providing a first inverting voltage adder and a node terminal to which said adder transmits the negative sum of said or input terminal voltages,
  (c) providing a second inverting voltage adder whose output is conveyed to said or output terminal and a plurality of parallel filtering paths for isolating different frequency components and connecting said node terminal and said second adder, wherein each of said parallel filter paths comprises a cascade of two identical RLC series filters each having one end of its resistor grounded and the other end serving as filter output, connected by an intervening clipper for truncating voltages of absolute value greater than some predetermined level,
  (d) applying input data wavetrains of the same phase and frequency as said sinusoidal voltage representing one to said or input terminals and causing, as a result of above provisions, said first adder's output voltage to flow through one of said parallel filtering paths unmodified if at least one of said input wavetrains has null amplitude or otherwise to be reduced to one half amplitude, and, after passing through said second inverting adder, to constitute said output data wavetrain, whereby said gate will permit combination into the same logic devices as standard two level or gates, and whereby said devices' will be able to parallel process input data wavetrains from different frequency information channels.

2. An electronic or logic gate wherein zero and one are represented, respectively, by sinusoidal voltages of null and unity amplitude, comprising:
  (a) a pair of or input terminals to receive input data wavetrains, an or output terminal to transmit said output data wavetrain, and a ground voltage supply terminal,
  (b) a first inverting voltage adder and a node terminal to which it transmits the negative sum of said or input terminal voltages,
  (c) a second inverting voltage adder whose output is connected to said or output terminal and a plurality of parallel filtering paths connecting said node terminal and said second adder, wherein each of said parallel filter paths comprises a cascade of two identical RLC series filters each having one end of its resistor grounded and the other end serving as filter output, and an intervening clipper for truncating voltages of absolute value greater than some predetermined level, whereby said gate will permit combination into the same logic devices as standard two level or gates, and whereby said devices will be able to parallel process input data wavetrains from different frequency information channels.

3. The electronic logic gate of claim 2 wherein said clipper comprises a resistor, positive and negative equal direct current biases to ground, and a pair of semiconductor diodes, one end of said resistor serving as clipper voltage input and the other end serving as clipper voltage output, the clipper output being connected to ground by two parallel paths each consisting of one of said diodes in reverse bias connection with one of said direct current biases.

4. The electronic logic gate of claim 2 wherein said clipper comprises a resistor, a pair of identical zener diodes, a pair of non zener semiconductor diodes and a capacitor, one end of said resistor serving as clipper voltage input and the other end serving as clipper voltage output, the clipper output being connected to ground by said capacitor and two parallel paths each comprised of a differently oriented one of said zener diodes connected in series to one of said non zener semiconductor diodes oriented so as to conduct zener breakdown current.

5. The electronic or logic gate of claim 2 wherein said or input and output terminals, ground voltage supply terminal, first and second inverting voltage adder, node terminal and plurality of parallel filtering paths are all monolithically integrated on a common substrate.

\* \* \* \* \*